United States Patent
Kuroki

[11] Patent Number: 6,128,209
[45] Date of Patent: Oct. 3, 2000

[54] SEMICONDUCTOR MEMORY DEVICE HAVING DUMMY BIT AND WORD LINES

[75] Inventor: Koji Kuroki, Tokyo, Japan

[73] Assignee: Oki Electric Industry Co., Ltd., Tokyo, Japan

[21] Appl. No.: 09/288,659

[22] Filed: Apr. 9, 1999

[30] Foreign Application Priority Data

May 28, 1998 [JP] Japan .................................. 10-147225

[51] Int. Cl.$^7$ ...................................................... G11C 5/06

[52] U.S. Cl. ...................... 365/63; 365/189.09; 365/200; 365/149; 257/296

[58] Field of Search ............................. 365/63, 200, 149, 365/189.09, 129, 189.01; 257/296

[56] References Cited

U.S. PATENT DOCUMENTS

| | | | |
|---|---|---|---|
| 5,281,555 | 1/1994 | Cho | 438/625 |
| 5,361,234 | 11/1994 | Iwase | 365/210 |
| 5,867,434 | 2/1999 | Oh et al. | 365/200 |
| 5,945,702 | 8/1999 | Nakanishi | 257/296 |
| 5,982,695 | 11/1999 | Mukai | 365/226 |

FOREIGN PATENT DOCUMENTS 60-177669 9/1985 Japan .
64/81358 3/1989 Japan .

*Primary Examiner*—David Nelms
*Assistant Examiner*—Hoai V. Ho
*Attorney, Agent, or Firm*—Jones Volentine, LLC

[57] ABSTRACT

A semiconductor memory device includes a semiconductor substrate having a memory cell array area, a peripheral circuit area surrounding the memory cell array area, and a boundary area located between the memory cell array area. The peripheral circuit area, the memory cell array area, and the boundary area are located on a principle surface of the semiconductor substrate. The device also includes word lines which extend parallel to each other in a first direction, a dummy word line which extends in the first direction, and an insulation layer covering over the word lines and the dummy word line. The device further includes bit lines and a dummy bit line respectively formed over the insulation layer and extending parallel to each other in a second direction substantially perpendicular to the first direction. Memory cells are located in the memory cell array area at intersections of the word lines and the bit lines, each of which includes a capacitor and a switching transistor. The dummy word line and the dummy bit line receive a same potential.

34 Claims, 8 Drawing Sheets

SEMICONDUCTOR MEMORY DEVICE HAVING DUMMY BIT AND WORD LINES

BACKGROUND OF THE INVENTION

FIELD OF THE INVENTION

The present invention generally relates to a semiconductor memory device, more particularly, to a semiconductor memory device having a dummy pattern.

This application is a counterpart of Japanese patent application, Ser. No. 147225/1998, filed May 28, 1998, the subject matter of which is incorporated herein by reference.

DESCRIPTION OF THE RELATED ART

A semiconductor memory device has a memory cell array area and a peripheral circuit area which encompasses the memory cell array area. In the memory cell array area, there are word lines formed on a semiconductor substrate so as to extend parallel to one another, bit lines formed over the word lines and intersecting the word lines, and memory cells formed where respective intersections of the word lines and the bit lines. In the peripheral circuit area, peripheral circuits, which are made up of a sense amplifier circuit, a decoder circuit, and a control circuit or the like, are formed.

Since the elements in the memory cell array area have the highest integration in the semiconductor memory device, any elements including the word lines, the bit lines, and the memory cells must be closely formed therein. On the other hand, high integration in the peripheral circuit area is not as difficult the memory cell array area. Therefore, the elements may be sparsely formed in the peripheral circuit area. As a result, intervals of the wirings and elements in the peripheral circuit area are wider than those of the memory cell array area.

In a photolithography and etching step in which materials are shaped into predetermined form to obtain elements or wirings (for example, the word lines and bit lines), it is not easy to apply a photoresist having uniform thickness onto an entire surface of a semiconductor wafer. Particularly, it is not easy to apply the photoresist so that its thickness is kept uniform in a boundary area between the memory cell array area (closed patterns are formed) and the peripheral circuit area (sparsed patterns are formed). As a result, if the exposed and developed conditions (photolithography condition or etching condition) are set with accuracy, the word line and the bit line which are positioned in an outermost memory cell array area tend to be patterned so that their widths are different from those of the other word lines and the bit lines because of focal depth difference between them.

In a conventional semiconductor memory device, a dummy word line and a dummy bit line are additionally formed in the boundary area (the outermost memory cell array area) to overcome the problem mentioned above. In this case, even if such problem occurs, only the dummy word line and the dummy bit line are affected by this phenomenon. This structure thus frees other word lines and the bit lines from such a problem. Accordingly, all word lines may be formed in the same width and all bit lines may be also formed in the same width. Furthermore, in the conventional semiconductor memory device, dummy active regions, which correspond to the dummy word line and the dummy bit line, are formed on the semiconductor substrate and are connected to the bit line and the dummy bit line.

However, as the size of the memory cell array continues to be reduced, it is hard to obtain a structural design margin in the boundary area as well. Therefore, if the thickness of the photoresist is uneven in the boundary area, it is difficult to accurately form a through hole, to contact the dummy active region with the dummy word line or the bit line, in an insulating layer positioned on the dummy active region. As a result, there is a possibility that the bit line is electrically connected to the dummy word line, or the dummy bit line is electrically connected to the word line or the dummy word line because of the lower structural design margin. That is, a short circuit is constituted between them.

A ground voltage potential VSS is normally supplied to the dummy word line and a ½ VDD (a half of a power supply potential) is supplied to the dummy bit line. Accordingly, if such short circuit occurs there, the voltage potentials of the bit line and the dummy bit line is decreased and thus an operation margin would be worse.

Consequently, there has been a need for an improved semiconductor memory device.

SUMMARY OF THE INVENTION

It is an object of the present invention is to provide a semiconductor memory device that may obtain a required operation margin.

According to one aspect of the present invention, for achieving the above object, there is provided a semiconductor memory device which includes a semiconductor substrate having a memory cell array area, a peripheral circuit area surrounding the memory cell array area, and a boundary area located between the memory cell array area. The peripheral circuit area, the memory cell array area, and the boundary area are located on a principle surface of the semiconductor substrate. The device also includes word lines extending parallel to each other in a first direction, a dummy word line extending in the first direction, and an insulation layer covering over the word lines and the dummy word line. The device further includes bit lines and a dummy bit line respectively formed over the insulation layer and extending parallel to each other in a second direction substantially perpendicular to the first direction. Memory cells are located in the memory cell array area at intersections of the word lines and the bit lines, each of which includes a capacitor and a switching transistor. The dummy word line and the dummy bit line receive a same potential.

The above and further objects and novel features of the invention will more fully appear from the following detailed description, appended claims and the accompanying drawings.

DETAILED DESCRIPTION OF THE PREFERRED EMBODIMENTS

First Embodiment

A semiconductor memory device according to the present invention will be explained hereinafter with reference to the figures.

Figure 1:
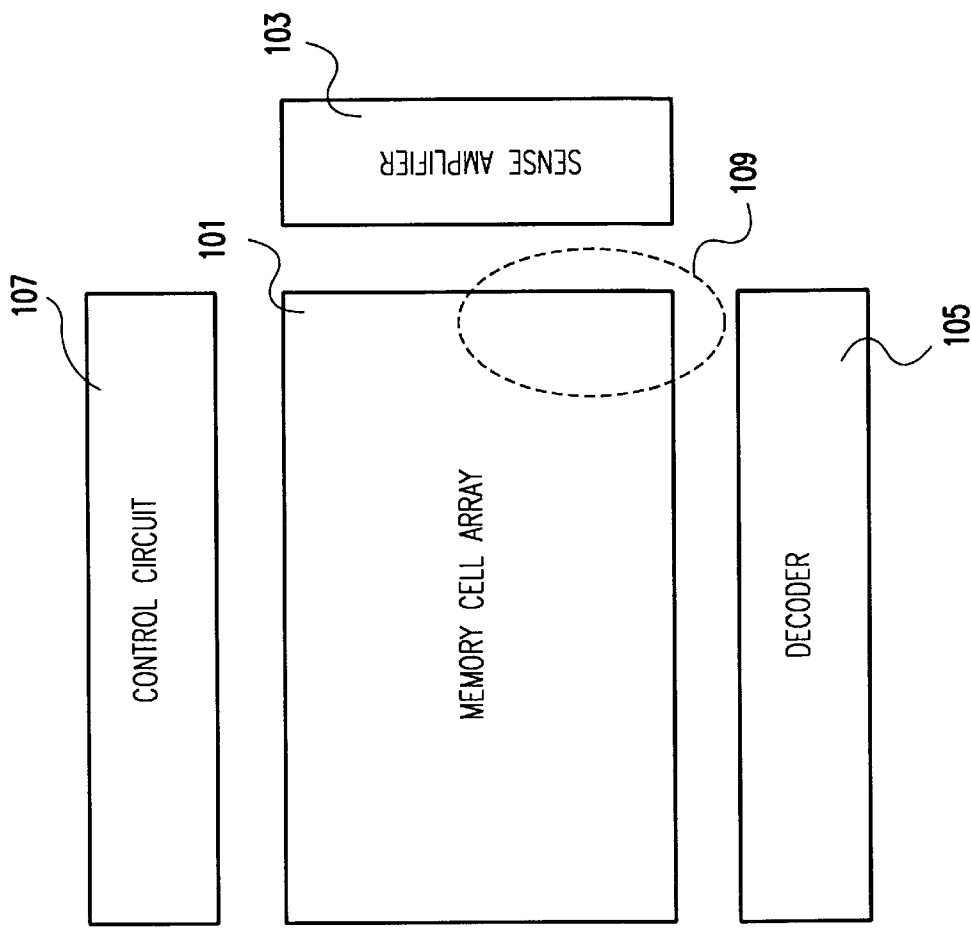
FIG. 1 is a schematic layout showing a semiconductor memory device according to the present invention.

FIG. 1 is a schematic layout showing a semiconductor memory device according to the present invention.

The semiconductor memory device has a memory cell array area and a peripheral circuit area which encompasses the memory cell array area.

A memory cell array 101 is formed in the memory cell array area. The memory cell array 101 includes word lines, bit lines and memory cells each of which is made up of a switching transistor and a capacitor. A sense amplifier 103, a decoder 105 and a control circuit 107 or the like are respectively formed in the peripheral circuit area as illustrated in FIG. 1.

Figure 2:
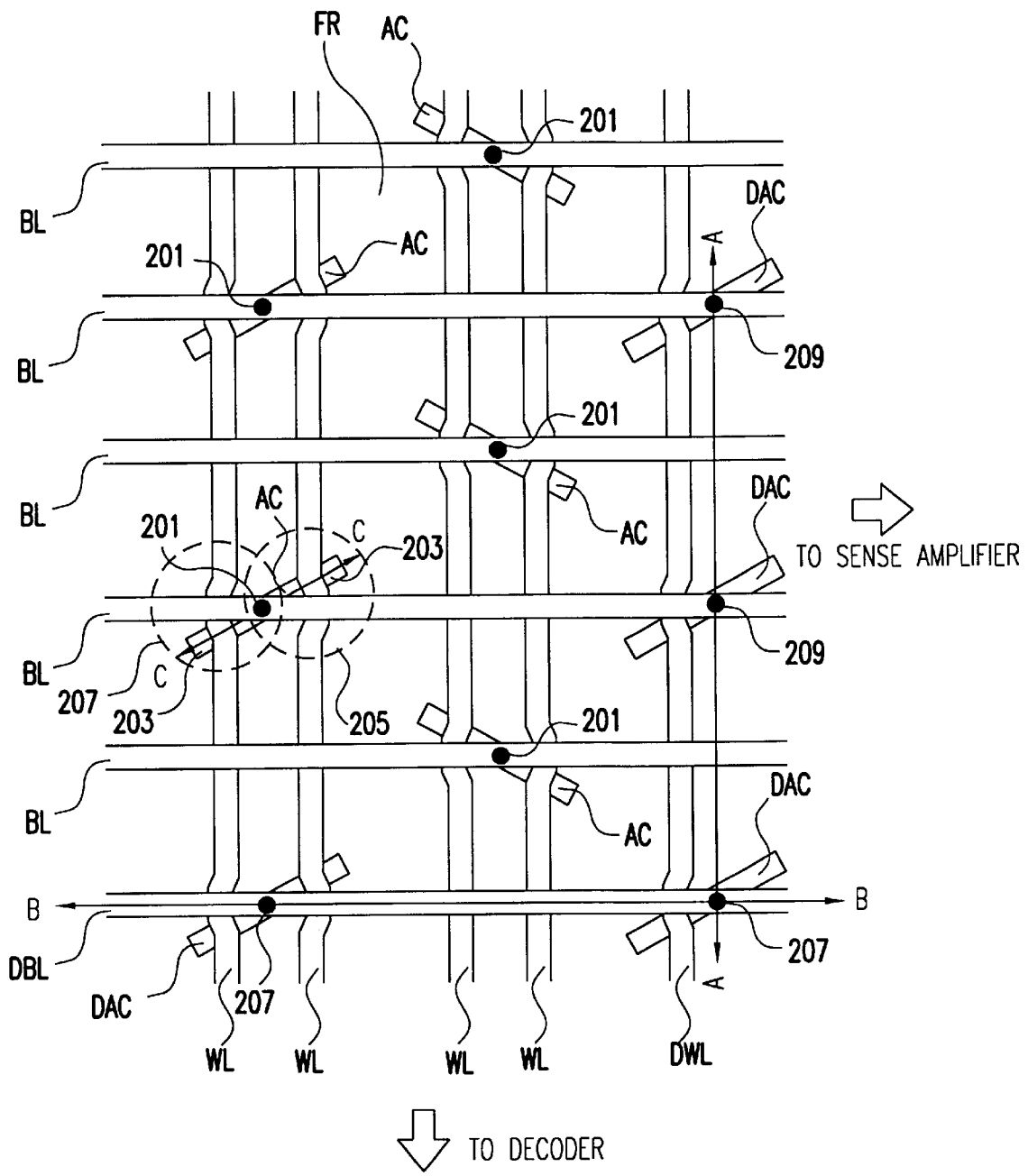
FIG. 2 is an expanded plan view of an area which is indicated by an encircled dotted line 109 in FIG. 1, according to the first preferred embodiment of the present invention.

FIG. 2 is an expanded plan view of an area which is indicated by an encircled dotted line 109 in FIG. 1, according to the first preferred embodiment of the present invention.

The semiconductor memory device has active regions AC and a field region FR which encompasses the active regions AC, each of which regions is formed on a semiconductor substrate. The field region FR is made of Local Oxidation of Silicon (hereinafter LOCOS oxide film). The active region AC has diffusion layers serving as source and drain electrodes of the switching transistor and a channel of the switching transistor.

The device further includes word lines WL which are extended substantially parallel to one another in the vertical direction of FIG. 2, bit lines BL and inverted bit lines/BL which are extended substantially parallel to one another in the horizontal direction perpendicular to the vertical direction.

Some portions of the word lines WL are laid on the active regions AC. These portions of the word lines WL, which are positioned just on the active regions AC, serve as gate electrodes of the switching transistors. Portions of the active regions AC where the word lines WL are not covered thereon function as the source or drain electrodes of the switching transistors.

The bit lines BL and inverted bit lines/BL are formed over the word lines WL so as to intersect the word lines WL. Some portions of the bit lines BL and the inverted bit lines/BL, which are indicated as blackened dot 201 and 209 (contact regions), are respectively connected to the corresponding active regions AC and dummy active regions DAC located respectively thereunder. The explanation of the dummy active region DAC will be described later.

The device also includes capacitors which are located at intersections of the word lines WL, the bit lines BL and the inverted bit lines/BL. In specifically, each capacitor has one electrode (a storage electrode), which is connected to a region 203 (a diffusion layer) in the active region and which extends over the bit lines BL, and another electrode (a plate electrode), which is coupled to the one electrode through a dielectric layer and elongated over the entire surface of the memory cell array area. (This feature is not illustrated in FIG. 2. This feature is also not described in following figures.) Therefore, the memory cels are positioned at regions indicated as dotted circles 205 and 207. The other memory cells, not explained above, are positioned at respective intersections in the same manner.

The semiconductor memory device additionally includes the dummy active regions DAC, a dummy word line WL, and a dummy bit line DBL, each of which is formed on a boundary area between the peripheral circuit area and the memory cell array area.

The dummy active regions DAC has the same diffusion layers as the active regions AC have. However, the diffusion layers are not necessary for the dummy active regions DAC, contrary to the active regions AC. This means the diffusion layers are optional.

The dummy word line DWL is extended substantially parallel to the word lines WL and is applied with a ½ VDD as a fixed voltage (a half of a power supply potential). Some portions of the dummy word line WL are laid on the dummy active regions DAC in the same manner of the word lines WL. However, since the fixed voltage of ½ VDD is applied to the dummy word line DWL, these portions of the dummy word lines DWL, which are positioned just on the dummy active region DAC, do not function as gate electrodes of the switching transistors. Accordingly, portions of the dummy active regions DAC which are not covered by the dummy word line DWL do not function as the source or drain electrodes of the switching transistors. Only one dummy word line DWL is described in this embodiment. However, one or more additional dummy word lines DWL may be formed in the boundary area.

The dummy bit line DBL is extended substantially parallel to the bit lines BL and is applied with the ½ VDD. The dummy bit line DBL is formed over the word lines WL and the dummy word line DWL so as to intersect them. Some portions of the dummy bit line DBL, which is indicated as blackened dot circles 207 (contact regions), are connected to the corresponding dummy active regions DAC located thereunder. Only one dummy bit line DBL is described in this embodiment. However, one or more additional dummy bit lines DBL may be located in the boundary area as well.

Figure 10:
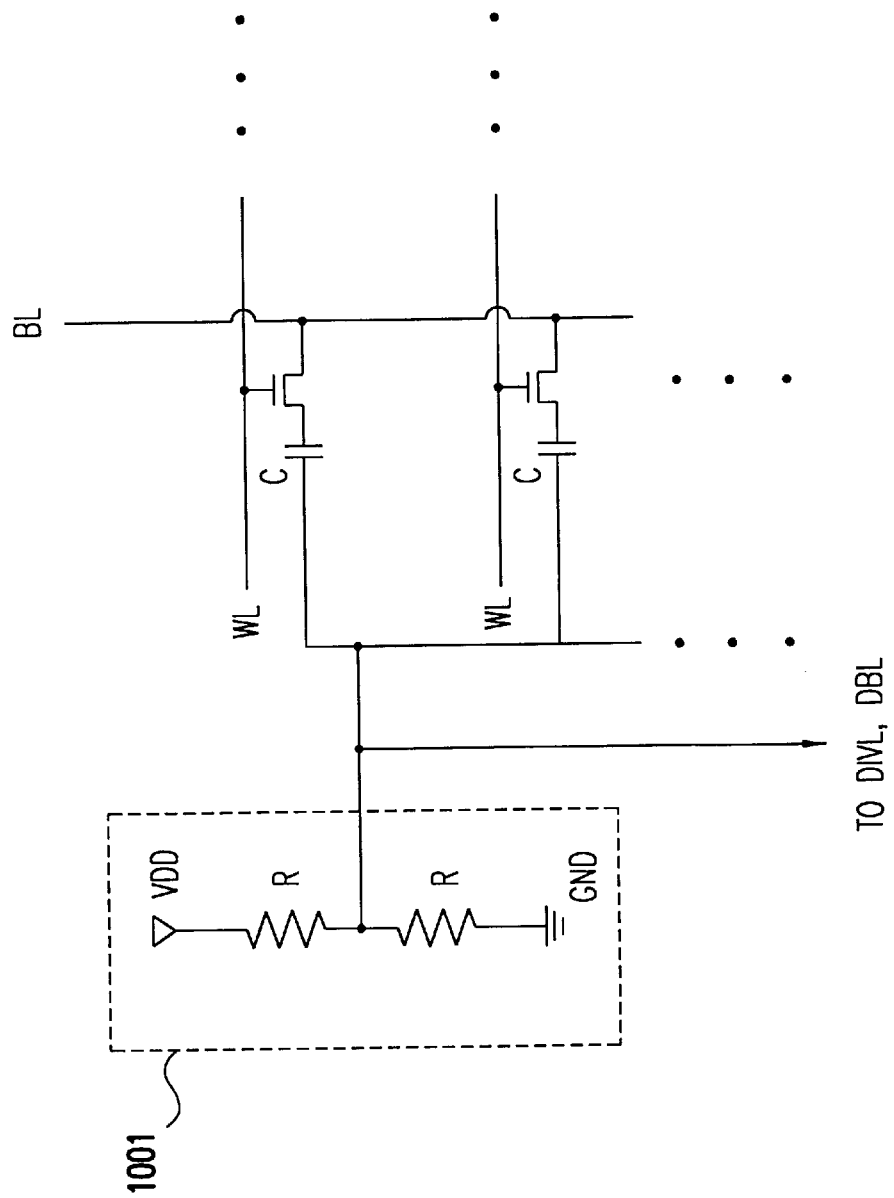
FIG. 10 is a circuit diagram showing a ½ VDD generator 1001.

FIG. 10 is a circuit diagram showing a ½ VDD generator 1001. The ½ VDD generator 1001, formed in the peripheral circuit area, is made up of two resistors R connected in series between a voltage source VDD and a ground GND. Since each of the resisters R has the same resistance, the ½ VDD generator 1001 outputs a potential which is ½0 VDD. This ½ VDD potential is, for example, applied to the cell plate electrodes of the memory cells as illustrated in FIG. 10. Furthermore, the ½ VDD potential is applied to the dummy word line DWL and the dummy bit line DBL. Since the output terminal of the ½ VDD generator 1001 is connected to the dummy word line DWL and the dummy bit line DBL in addition to the cell plate, the wiring capacitance which is coupled to the ½ VDD generator 1001 is increased. Therefore, the output of the ½ VDD generator 1001 (½ VDD) can be stabilized because of this increased wiring capacitance.

The fixed voltage applied to the dummy word line DWL and the dummy bit line DBL is not limited to the ½ VDD potential. The ½ VDD potential may be replaced with the voltage source VDD or the ground GND, or source other fixed voltage.

In this embodiment, no storage electrodes are formed over the dummy active regions DAC. Namely, no memory cells are substantially positioned in the boundary area. However, since the dummy word line DWL does not serve as the gate electrode of a transistor and the dummy bit line DBL also does not function as a wiring for data reading/writing, such storage electrodes may be formed in the boundary area as well as other storage electrodes in the memory cell array area.

Figure 3:
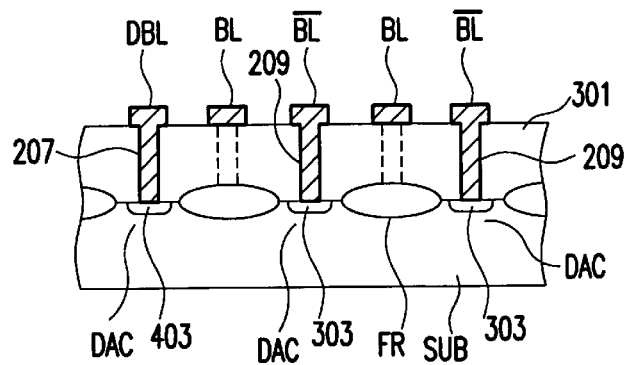
FIG. 3 is a cross sectional view taken on line A—A of FIG. 2.

FIG. 3 is a cross sectional view taken on line A—A of FIG. 2.

The inverted bit lines/BL and the dummy bit line DBL are respectively connected to a diffusion layer 303 and a diffusion layer 403 in the dummy active regions DAC through the through holes 209 and 207 which are defined by a interlevel insulator 301. The bit lines BL are connected to the respective active regions AC in the memory cell array area in the same manner of the inverted bit lines/BL as indicated by dotted lines.

Figure 4:
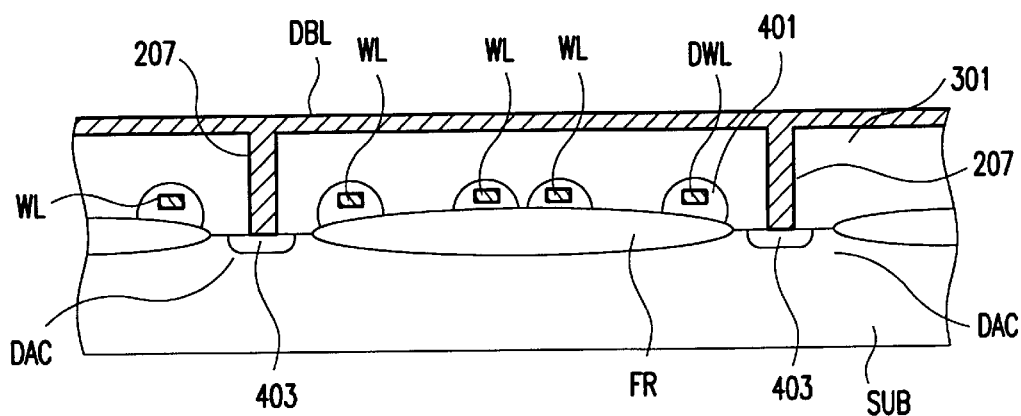
FIG. 4 is a cross sectional view taken on line B—B of FIG. 2.

FIG. 4 is a cross sectional view taken on line B—B of FIG. 2.

The dummy bit line DBL is connected to the diffusion layers 403 in the dummy active regions DAC through the through holes 207 which are defined by the interlevel insulator 301. The word lines WL and the dummy word line DWL are located over the LOCOS oxide film (the field region FR). The word lines WL and the dummy word line DWL are covered by an insulation layer 401.

Figure 5:
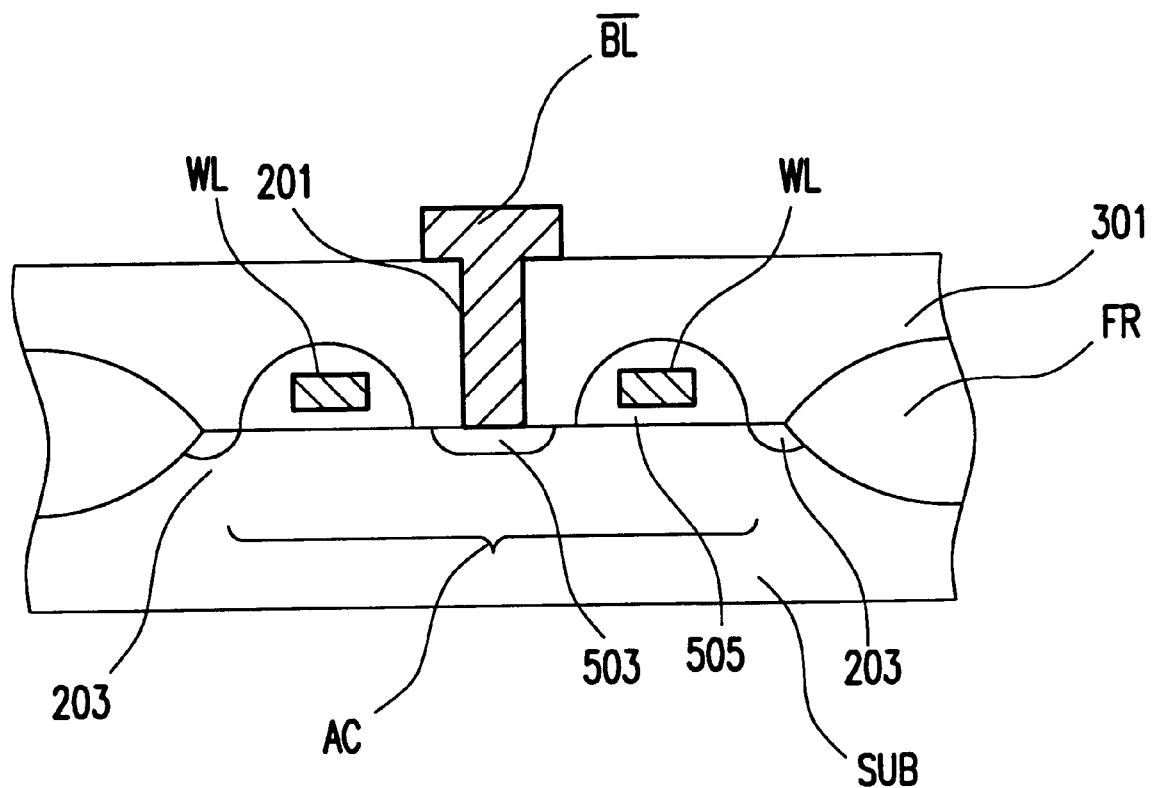
FIG. 5 is a cross sectional view taken on line C—C of FIG. 2.

FIG. 5 is a cross sectional view taken on line C—C of FIG. 2.

The inverted bit line/BL is connected to a diffusion layer 503 in the active region AC through the through hole 201 which are defined by the interlevel insulator 301. The word lines WL are located over the active region AC and formed on gate oxide films 505 which are respectively formed thereunder.

Next, a fabrication method of the semiconductor memory device of the first preferred embodiment according to the present invention will be explained hereinafter. The method for fabricating the capacitors and the peripheral circuits is omitted in following explanations.

First, LOCOS oxide film is formed on the particular region of a surface of the semiconductor substrate using well known technique so that the LOCOS oxide film defines the active regions AC and the dummy active regions DAC.

Next, the gate oxide film 505, the word lines WL and the dummy word line DWL are respectively formed on and over the semiconductor substrate.

Next, the diffusion layers 203, 303 and 403 are respectively formed into corresponding active regions AC and corresponding dummy active regions DAC.

Subsequently, the interlevel insulator 301 is formed on an entire surface of the semiconductor substrate including the word lines WL and the dummy word line WL.

After that, through holes 201, 207 and 209 are formed in portions of the interlevel insulator 301 which are located just over respective diffusion layers 303 and 403 using the well known photolithography and etching techniques.

Next, the bit lines BL and the dummy bit line DBL are formed on the inter level insulator 301 so as to connect them with corresponding active regions AC and dummy active regions DAC (diffusion layers 303, 403 and 503).

In the first preferred embodiment of the present invention, the voltage potential applied to the dummy word line and the voltage potential applied to the dummy bit line are set to the same voltage potential. Therefore, even if the short circuit is constituted between them, the operation margin does not become worse.

Second Embodiment

A semiconductor integrated circuit according to the second preferred embodiment will be explained hereinafter. The difference between the second preferred embodiment and the first preferred embodiment resides in the structures of the contact regions 607 and 609 which are located on the active regions.

Figure 6:
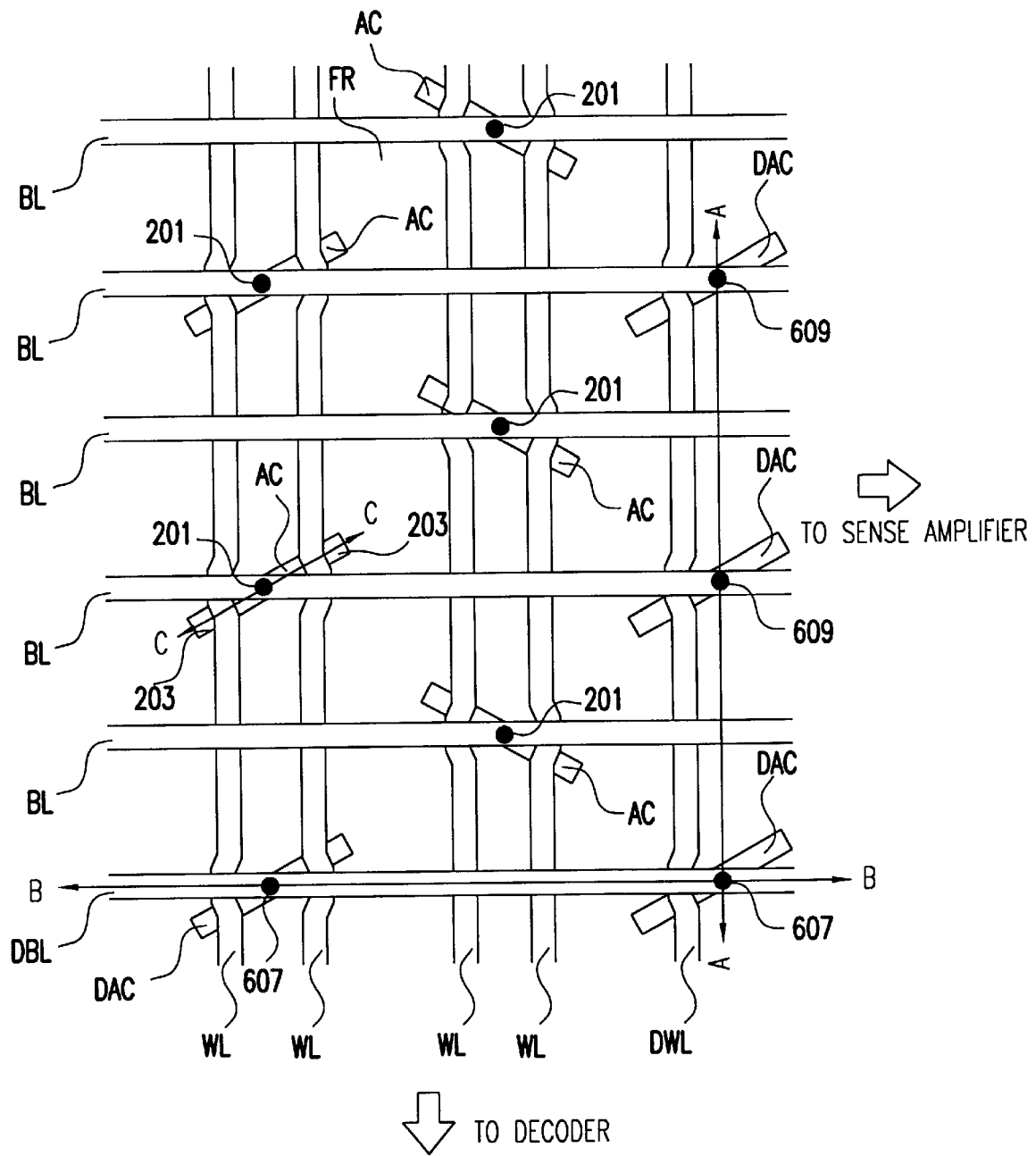
FIG. 6 is an expanded plan view of an area which is indicated by the encircled dotted line 109 in FIG. 1, according to the second preferred embodiment of the present invention.

FIG. 6 is an expanded plan view of an area which is indicated by the encircled dotted line 109 in FIG. 1, according to the second preferred embodiment of the present invention. In FIG. 6, non-blackened dots 607 and 609 indicate that the inverted bit lines/BL and the dummy bit line DBL are not connected to the dummy active regions DAC located thereunder (that is, non-blackened dote 607 and 609 indicate non contact regions). In the second preferred embodiment, the voltage potential of ½ VDD is applied to the dummy word line DWL and the dummy bit line DBL as well as the first preferred embodiment.

Figure 7:
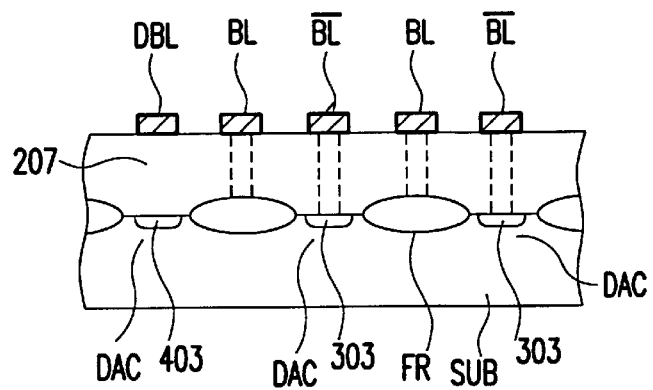
FIG. 7 is a cross sectional view taken on line A—A of FIG. 6.

FIG. 7 is a cross sectional view taken on line A—A of FIG. 6.

The inverted bit lines/BL and the dummy bit line DBL are not connected to the diffusion layer 303 and the diffusion layer 403 in the dummy active regions DAC. Namely, there are no through holes between the inverted bit lines/BL and the dummy active regions DAC. There are no through hole between the dummy bit line DBL and the dummy active regions DAC.

The bit lines BL and the inverted bit lines/BL are connected to the respective active regions AC in the memory cell array area in the same manner of the first preferred embodiment as indicated by dotted lines.

Figure 8:
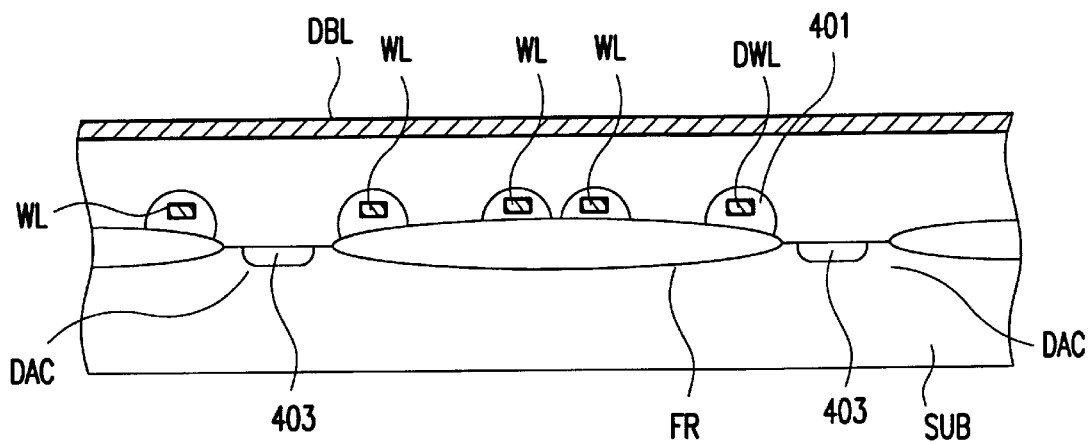
FIG. 8 is a cross sectional view taken on line B—B of FIG. 6.

FIG. 8 is a cross sectional view taken on line B—B of FIG. 6.

The dummy bit line DBL is not connected to the diffusion layers 403 in the dummy active regions. Namely, there are no through holes between the dummy bit line DBL and the dummy active regions DAC.

The word lines WL and the dummy word line DWL are located over the LOCOS oxide film (the field region FR). The word lines WL and the dummy word line DWL are covered by the insulation layer 401.

Figure 9:
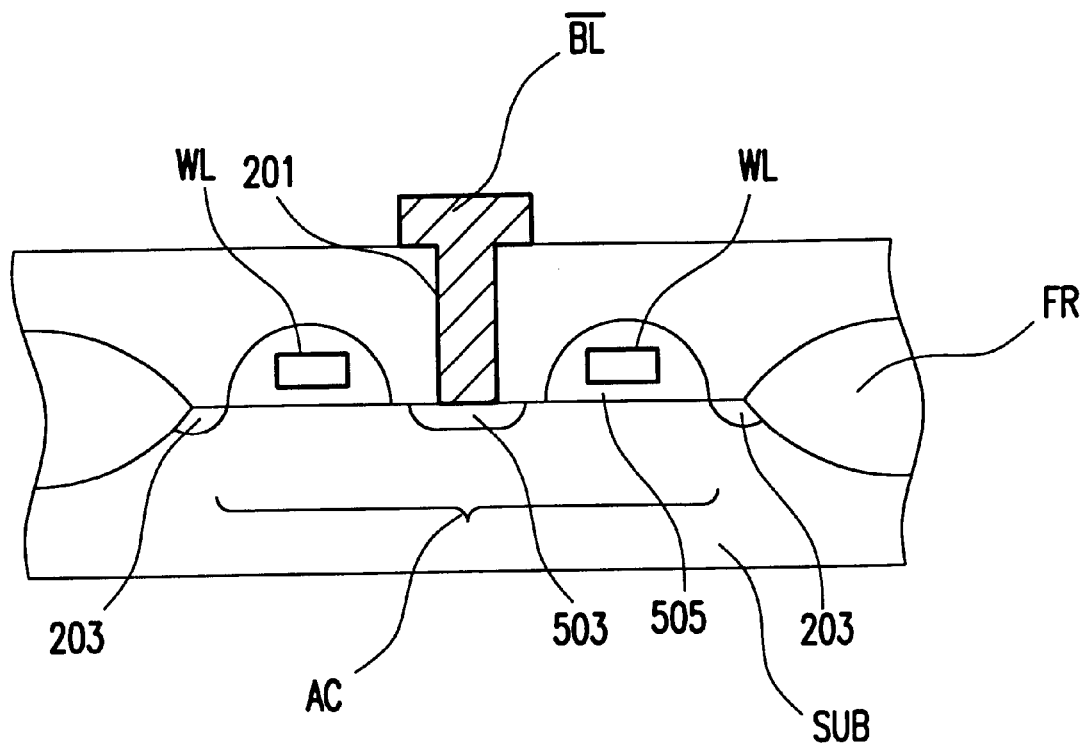
FIG. 9 is a cross sectional view taken on line C—C of FIG. 6.

FIG. 9 is a cross sectional view taken on line C—C of FIG. 6.

The inverted bit line/BL is connected to the diffusion layer 503 in the active region AC through the through hole 201 which are defined by the interlevel insulator 301. The word lines WL are located over the active region AC and formed on gate oxide films 505 which is respectively formed thereunder.

Next, a fabrication method of the semiconductor memory device of the second preferred embodiment according to the present invention will be explained hereinafter. The method for fabricating the capacitors and the peripheral circuits is omitted in following explanations.

First, LOCOS oxide film is formed on the particular region of a surface of the semiconductor substrate using well known technique so that the LOCOS oxide film defines the active regions AC and the dummy active regions DAC.

Next, the gate oxide film 505, the word lines WL and the dummy word line DWL are respectively formed on and over the semiconductor substrate.

Next, the diffusion layers 203, 303 and 403 are respectively formed into corresponding active regions AC and corresponding dummy active regions DAC.

Subsequently, the interlevel insulator 301 is formed on an entire surface of the semiconductor substrate including the word lines WL and the dummy word line WL.

After that, through holes 201 are formed in portions of the inter level insulator 301 which are located just over respective diffusion layers 201 and using the well known photolithography and etching techniques.

Next, the bit lines BL and the dummy bit line DBL are formed on the interlevel insulator 301 so as to connect them with corresponding active regions AC (diffusion layers 503).

In the second preferred embodiment of the present invention, the dummy active region DAC is not connected to both of the bit line BL and the dummy bit line DBL in the boundary area where it is hard to obtain better structural design margin. That is, there are no through holes between the bit lines BL (the inverted bit lines/BL) and the dummy active regions DAC located just thereunder. Accordingly, the bit lines BL (the inverted bit lines/BL) are not electrically connected to the dummy word line DWL (the short circuit is not constituted between them). Furthermore, there are no through holes between the dummy bit lines DBL and the dummy active regions DAC located just thereunder. Therefore, the dummy bit line DBL are not electrically connected to the word lines WL and the dummy word line DWL (the short circuit is not constituted between them). As a result, the operation margin does not become worse. Furthermore, the voltage potential applied to the dummy word line and the voltage potential applied to the dummy bit line are set to the same voltage potential. Therefore, the second preferred embodiment may obtain better operation margin than the first preferred embodiment.

While the preferred form of the present invention has been described, it is to be understood that modifications will be apparent to those skilled in the art without departing from the spirit of the invention.

The scope of the invention, therefore, is to be determined solely by the following claims.

What is claimed is:

1. A semiconductor device comprising:
   a semiconductor substrate having a memory cell array area, a peripheral circuit area surrounding the memory cell array area, and a boundary area located between the memory cell array and the peripheral circuit area, wherein the memory cell array area, the peripheral circuit area and the boundary area are located on a principal surface of the semiconductor substrate;
   a plurality of active regions formed in the memory cell array area;
   a plurality of dummy active regions formed in the boundary area;
   a plurality of word lines which extend parallel to each other in a first direction and which cross over said active regions;
   a dummy word line which extends in the first direction and which crosses over said dummy active regions;
   an insulation layer covering over said word lines and said dummy word line;
   a plurality of bit lines, formed over said insulation layer, and which extend parallel to each other in a second direction substantially perpendicular to the first direction and which cross over said active regions and said dummy active regions, and said plurality of bit lines being electrically connected to said active regions by through holes defined in said insulation layer, and said plurality of bit lines being electrically isolated from said dummy active region;
   a dummy bit line, formed over said insulation layer, and which extends in a second direction and which cross over said active regions and said dummy active regions, and said dummy bit line being electrically isolated from said dummy active regions; and
   a plurality of memory cells, which are arranged at said active regions, each of which includes a capacitor and a switching transistor.

2. The semiconductor memory device as set forth claim 1, wherein said dummy word line receives a fixed potential.

3. The semiconductor memory device as set forth claim 2, wherein the fixed potential is a power supply potential.

4. The semiconductor memory device as set forth claim 2, wherein the fixed potential is half of a power supply potential.

5. The semiconductor memory device as set forth claim 2, wherein the fixed potential is a ground potential.

6. The semiconductor memory device as set forth in claim 1, wherein said dummy word line crosses over a first subset of said plurality of dummy active regions, and wherein said dummy bit line crosses over a second subset of said dummy active regions.

7. The semiconductor memory device as set forth claim 6, wherein said dummy bit line receives a fixed potential.

8. The semiconductor memory device as set forth claim 7, wherein the fixed potential is a power supply potential.

9. The semiconductor memory device as set forth claim 7, wherein the fixed potential is half of a power supply potential.

10. The semiconductor memory device as set forth claim 7, wherein the fixed potential is a ground potential.

11. The semiconductor memory device as set forth claim 7, wherein the fixed potential is applied to said dummy word line.

12. The semiconductor memory device as set forth claim 11, wherein the fixed potential is a power supply potential.

13. The semiconductor memory device as set forth claim 11, wherein the fixed potential is half of a power supply potential.

14. The semiconductor memory device as set forth claim 11, wherein the fixed potential is a ground potential.

15. The semiconductor memory device comprising:
   a semiconductor substrate having a memory cell array area, a peripheral circuit area surrounding the memory cell array area, and a boundary area located between the memory cell array area and the peripheral circuit area, wherein the memory cell array area, the peripheral circuit area and the boundary area are located on a principal surface of the semiconductor substrate;
   a plurality of active regions formed in the memory cell array area;
   a plurality of dummy active regions formed in the boundary area;
   a plurality of word lines which extend parallel to each other in a first direction and which cross over said active regions;
   an insulation layer covering over said word lines;
   a plurality of bit lines, formed over said insulation layer, which extend parallel to each other in a second direction substantially perpendicular to the first direction and which cross over said active regions and said dummy active regions, said plurality of bit lines being electrically connected to said active regions by through holes defined in said insulation layer, and said plurality of bit lines being electrically isolated from said dummy active regions;
   a dummy bit line, formed over said insulation layer, which extends in the second direction which crosses over said dummy active regions, said dummy bit line being electrically isolated from said dummy active regions; and a plurality of memory cells, which are arranged at said active regions, each of which includes a capacitor and a switching transistor.

16. The semiconductor memory device as set forth claim 15, wherein said dummy bit line receives a fixed potential.

17. The semiconductor memory device as set forth claim 16, wherein the fixed potential is a power supply potential.

18. The semiconductor memory device as set forth claim 16, wherein the fixed potential is half of a power supply potential.

19. The semiconductor memory device as set forth claim 16, wherein the fixed potential is a ground potential.

20. The semiconductor memory device as set forth claim 15, wherein said dummy bit line crosses over a first subset of said dummy active regions, and wherein said device further comprises a dummy word line, formed under said insulation layer, which extends in the first direction and which crosses over a second subset of said dummy active regions.

21. The semiconductor memory device as set forth claim 20, wherein said dummy word line receives a fixed potential.

22. The semiconductor memory device as set forth claim 21, wherein the fixed potential is a power supply potential.

23. The semiconductor memory device as set forth claim 21, wherein the fixed potential is a half of a power supply potential.

24. The semiconductor memory device as set forth claim 21, wherein the fixed potential is a ground potential.

25. The semiconductor memory device as set forth claim 21, wherein the fixed potential is applied to said dummy bit line.

26. The semiconductor memory device as set forth claim 25, wherein the fixed potential is a power supply potential.

27. The semiconductor memory device as set forth claim 25, wherein the fixed potential is a half of a power supply potential.

28. The semiconductor memory device as set forth claim 25, wherein the fixed potential is a ground potential.

29. A semiconductor memory device comprising:
a semiconductor substrate having a memory cell array area, a peripheral circuit area surrounding the memory cell array area, and a boundary area located between the memory cell array area and the peripheral circuit area, wherein the memory cell array area, the peripheral circuit area and the boundary area are located on a principal surface of the semiconductor substrate;
a plurality of word lines which extend parallel to each other in a first direction;
a dummy word line which extends in the first direction;
an insulation layer covering over said word lines and said dummy word line;
a plurality of bit lines, formed over said insulation layer, which extend parallel to each other in a second direction substantially perpendicular to the first direction;
a dummy bit line, formed over said insulation layer, which extends in the second direction;
a plurality of memory cells, located in said memory cell array area at intersections of said word lines and said bit lines, each of which includes a capacitor and a switching transistor; and a voltage source which applies a same potential to both said dummy word line and said dummy bit line.

30. The semiconductor memory device as set forth claim 29, wherein the potential is a fixed potential.

31. The semiconductor memory device as set forth claim 30, wherein the fixed potential is a power supply potential derived from a power supply.

32. The semiconductor memory device as set forth claim 30, wherein the fixed potential is a ground potential derived from a ground.

33. The semiconductor memory device as set forth claim 30, wherein the fixed potential is half of a power supply potential.

34. A semiconductor memory device comprising:
a semiconductor substrate having a memory cell array area, a peripheral circuit area surrounding the memory cell array area, and a boundary area located between the memory cell array and the peripheral circuit area, wherein the memory cell array area, the peripheral circuit area and the boundary area are located on a principal surface of the semiconductor substrate;
a plurality of active regions formed in the memory cell array area;
a plurality of dummy active regions formed in the boundary area;
a plurality of word lines which extend parallel to each other in a first direction and which cross over a first portion of each of said active regions;
a dummy word line which extends in the first direction and which crosses over a first portion of each of said dummy active regions;
a plurality of bit lines which extend parallel to each other in a second direction substantially perpendicular to the first direction and which cross over a second portion of each of said active regions and a second portion of each of said dummy active regions;
a dummy bit line which extends in the second direction and which cross over a third portion of each of said dummy active regions;
an insulating layer covering each of said plurality of word lines, said first portions of said active regions, and said first and second portions of said dummy active regions;
a plurality of memory cells, which are arranged at said active regions, each of which includes a capacitor and a switching transistor; and
wherein said plurality of bit lines are formed over said insulating layer and connected to said second portions of said active regions by through holes defined in said insulating layer, wherein said plurality of bit lines are electrically isolated from said dummy active regions by said insulating layer covering said second portions of said dummy active regions, and wherein said dummy bit line is electrically isolated from said dummy active regions by said insulating layer covering said third portions of said dummy active regions.

* * * * *